United States Patent [19]
Shiloh et al.

[11] Patent Number: 5,148,111
[45] Date of Patent: Sep. 15, 1992

[54] ELECTROMAGNETIC PULSE SIMULATOR

[75] Inventors: Joseph Shiloh, Haifa; Avner Rosenberg, Beit Shearim, both of Israel

[73] Assignee: State of Israel, Ministry of Defense, Rafael-Armament Development Authority, Haifa, Israel

[21] Appl. No.: 674,265

[22] Filed: Mar. 25, 1991

[30] Foreign Application Priority Data

Apr. 27, 1990 [IL] Israel ......................................... 94232

[51] Int. Cl.$^5$ ........................... H03K 3/01; H03K 3/04
[52] U.S. Cl. .......................................... 328/65; 328/67
[58] Field of Search .................................. 328/65–67; 315/227, 238; 313/264; 434/218

[56] References Cited

U.S. PATENT DOCUMENTS

| | | | |
|---|---|---|---|
| 3,405,287 | 10/1968 | Miller | 328/65 |
| 4,232,319 | 11/1980 | Fusinski | 343/703 |
| 4,605,916 | 8/1986 | Tehori | 333/245 |
| 4,719,429 | 1/1988 | Ikezi et al. | 328/65 |
| 4,885,974 | 12/1989 | Honig | 328/67 |

OTHER PUBLICATIONS

IEEE Transactions on Antennas and Propagation vol. AP-26, No. 1, Jan. 1978, N.Y., US pp. 53–59; Ian D. Smith et al.: 'Pulsed Power for EMP Simulator'.
IEEE International Symposium on Electromagnetic Compatibility 1987, N.Y. US, pp. 135–138.

*Primary Examiner*—Timothy P. Callahan
*Attorney, Agent, or Firm*—Benjamin J. Barish

[57] ABSTRACT

An electromagnetic pulse simulator includes two large-area electrodes mounted in spaced apart relation, and a high voltage generator electrically connected to the two electrodes to apply a high voltage between them. The electrical connection of the high-voltage generator and at least one of the electrodes comprises a plurality of electrical conductors in mutually-spaced relation with each conductor being enclosed within an insulating sheath filled with an insulating gas under pressure.

20 Claims, 3 Drawing Sheets

ELECTROMAGNETIC PULSE SIMULATOR

FIELD AND BACKGROUND OF THE INVENTION

The present invention relates to high voltage electrical apparatus. The invention is particularly applicable to electrical apparatus useful as an electromagnetic pulse (EMP) simulator, and is therefore described below with respect to this application.

As well known, a nuclear explosion generates an intense electromagnetic pulse (EMP) reaching amplitudes of tens of kilovolts per meter with a rise time of few nanoseconds. Such EMP's can disable or damage electronic and electrical equipment unless the equipment is protected, or "hardened", against such EMP's. Similar EMP s can be generated by lightening in nature. Accordingly, EMP simulators have been developed to simulate the effects of such EMP's in order to test their effects on electrical and electronic equipment.

One form of EMP simulator includes two large-area electrodes mounted in spaced relation, and a high-voltage generator electrically connected to the two electrodes to apply a high-voltage pulse between them. The equipment to be tested is placed between the two electrodes in order to test how the simulated EMP affects the equipment operation. The high-voltage pulse applied to the two electrodes is in the order of one megavolt, and the rise time is extremely fast, in the order of 5 nanoseconds.

Such a large voltage pulse requires a relatively large spacing between the electrodes in order to avoid arcing. However, a large spacing between the two electrodes increases the inductance of the electrical curcuit, thereby increasing the rise time. For this reason, EMP simulators of this type usually include electrical connections between the high voltage generator and the two electrodes enclosed which are within a housing filled with an insulating gas under pressure.

Because of the required spacing between the two electrodes at their point of connection to the high-voltage generator, a very large housing is generally required which is filled with the insulating gas under pressure. Such a construction is not only space-consuming but also very expensive, because of the large amount of insulating gas required to fill the enclosure under pressure. Moreover, the insulating gas commonly used is a halogenated gas (e.g. "Freon"), which has been found to create serious ecological problems. Further, the large size of the housing to be filled with the insulating gas greatly limits the pressure that can be safely used.

OBJECTS AND BRIEF SUMMARY OF THE INVENTION

An object of the present invention is to provide high-voltage electrical apparatus particularly useful as an EMP simulator having advantages in the above respects.

According to the present invention, there is provided electrical apparatus particularly useful as an electromagnetic pulse simulator including a pair of large-area electrodes mounted in spaced apart relation, and a high voltage generator electrically connected to the two electrodes to apply a high voltage between them; characterized in that the electrical connection of the high-voltage generator to at least one of the electrodes comprises a plurality of electrical conductors in mutually-spaced relation with each conductor being enclosed within an insulating sheath filled with an insulating gas under pressure. The electrical conductors are electrically connected in parallel between the high-voltage generator and the one electrode.

According to further features in the described preferred embodiment, the sheathed electrical conductors fan sideways from their one ends connected to said high-voltage generator towards their opposite ends. That is, the ends of the sheathed electrical conductors connected to the one electrode are spaced further apart from each other than the ends of the sheathed electrical conductors connected to the high-voltage generator. The sheathed electrical conductors also diverge outwardly from their one ends connected to said high-voltage generator away from the other electrode. The sheathed electrical conductors are coplanar with the one electrodes to shich they are connected.

According to still further features in the described preferred embodiment, each of the electrical conductors is electrically connected to one edge of said first electrode by a second plurality of electrical conductors coplanar with said plurality of sheathed electrical conductors and fanning sideways from their points of connection to their respective sheathed electrical conductors towards their opposite ends connected to the one electrode. That is, the ends of the second plurality of electrical conductors for each sheathed electrical conductor are spaced further apart from each other at their ends connected to the one electrode than at their ends connected to the respective sheathed electrical conductor.

As will be better understood from the description below, the foregoing features enable electrical apparatus to be constructed particularly useful as in EMP simulator producing very high voltage pulses, in the order of one megavolt, having very fast rise times, in the order of five nanoseconds or less. Also, such apparatus requires substantially less space and less insulating gas, and permits higher gas pressures, than the presently used EMP simulators.

Further features and advantages of the invention will be apparent from the discription below.

BRIEF DESCRIPTION OF THE DRAWINGS

The invention is herein described, by way of example only, with reference to the accompanying drawings, wherein.

DESCRIPTION OF A PREFERRED EMBODIMENT

Figure 1:
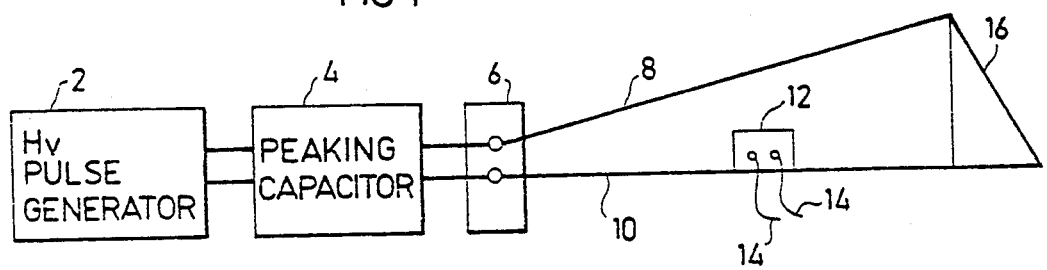
FIG. 1 diagramatically illustrates one form of EMP simulator constructed in accordance with the present invention.

Reference is first made to FIG. 1 illustrating one form of EMP simulator constructed in accordance with the present invention. Such a simulator includes a high voltage pulse generator 2, such as a bank of capacitors charged in parallel and discharged in series, and a peaking capacitor for peaking the high voltage pulse outputed by generator 2. The simulator further includes electrical connections, schematically indicated by box 6, for applying the high voltage pulses between a pair of spaced, large-area electrodes 8, 10 in order to generate an EMP simulating that produced by a nuclear explosion or natural lightening. The electrical or electronic equipment to be tested, schematically indicated at 12, is placed between the two electrodes 8, 10, so that the effect such an EMP has on its operation can be detected from its output conductors 14. In this type of EMP simulator, the two large-area electrodes 8, 10 diverge from each other in the area where the tested equipment 12 is to be located and then converge toward each other at their opposite end 16 to absorb the generated EMP.

As indicated earlier, the conventional EMP simulator of this type in present use requires, for the electrical connections schematically indicated by box 6, an enclosure of substantially the size of a room completely filled with an insulating gas. Such a construction is not only space-consuming, but also very expensive because of the large quantity of insulating gas required. Moreover, such a construction imposes practical limits as to the gas pressure which can be safely used because of the large size of the enclosure.

According to the present invention, the electrical connections between the peaking capacitor 4 of the high voltage pulse generator 2, and at least one of the electrodes 8, includes a plurality of electrical conductors in mutually spaces relation and enclosed within an insulating sheath filled with an insulating gas under pressure. Thus, instead of filling a substantially room-size enclosure with insulating gas, only the insulating sheath of each of the electrical conductors needs to filled with the gas, thereby provided substantial savings not only in the volume of the enclosure, but also in the quantity of the insulating gas required. In addtion, since the volume of the insulating gas is substantially less, its pressure may be increased in order to optimize its insulating characteristics.

Figure 2:
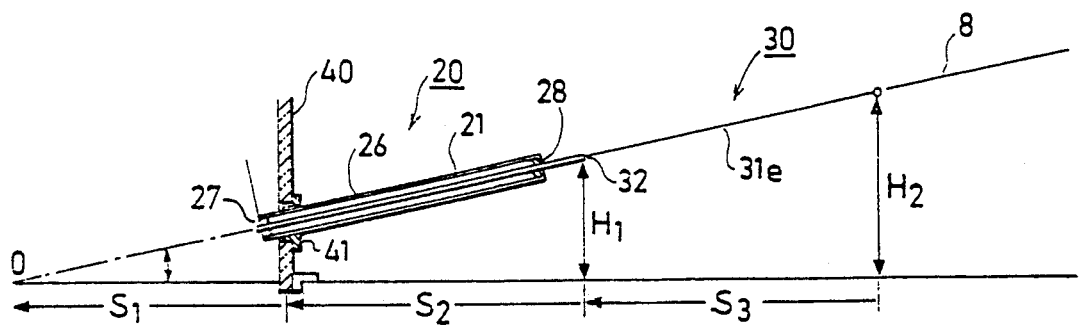
FIGS. 2 and 3 are side and plan views, respectively, illustrating the electrical connections between the high voltage pulse generator and the two electrodes in the EMP simulator of FIG. 1.
Figure 3:
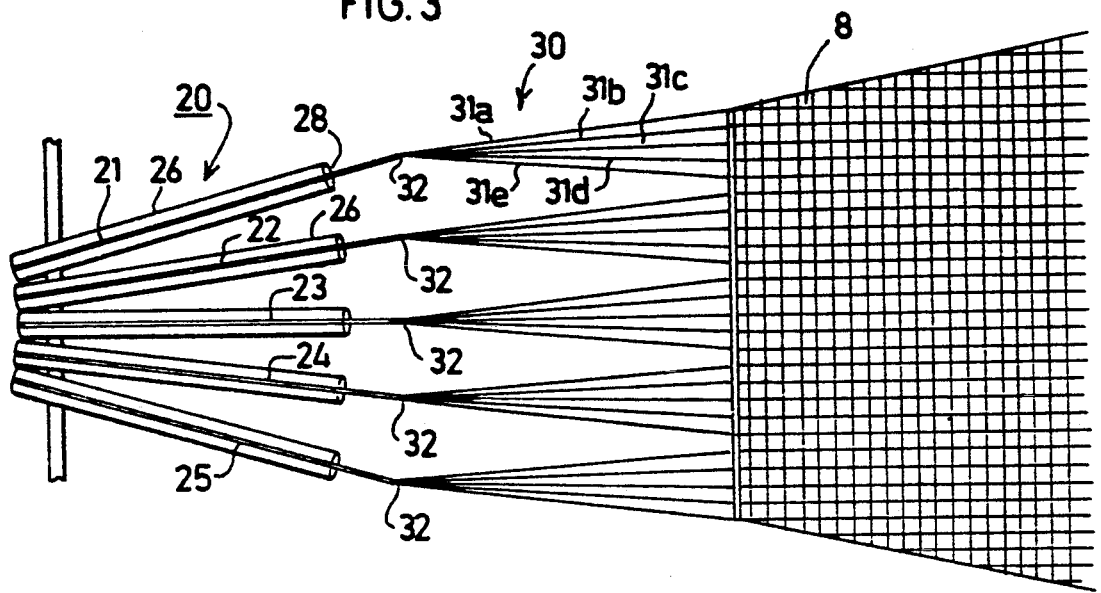

The foregoing construction is more particularly illustrated in FIGS. 2 and 3. In the example illustrated in these figures, the large-area electrode 8 is in the form of a wire mesh of triangular configuration, being connected at its truncated apex to the peaking capacitor 4 of the high voltage pulse generator 2; whereas the other large-area electrode 10, which serves as the ground electrode, is a solid metal plate of rectangular configuration.

As shown in the drawings, the peaking capacitor 4 of the high voltage pulse generator 2 is connected to one edge of electrode 8 by a first group of electrical conductors 20 fanning sideways from each other, with each of such electrical conductors being electrically connected to a second group of electrical conductors 30 also fanning sideways with respect to each other.

Figure 4:
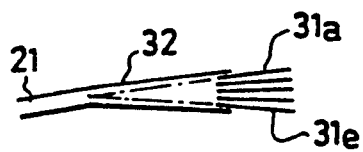
FIG. 4 illustrates the fanning out of one group of conductors into a second group of conductors.
Figure 5:
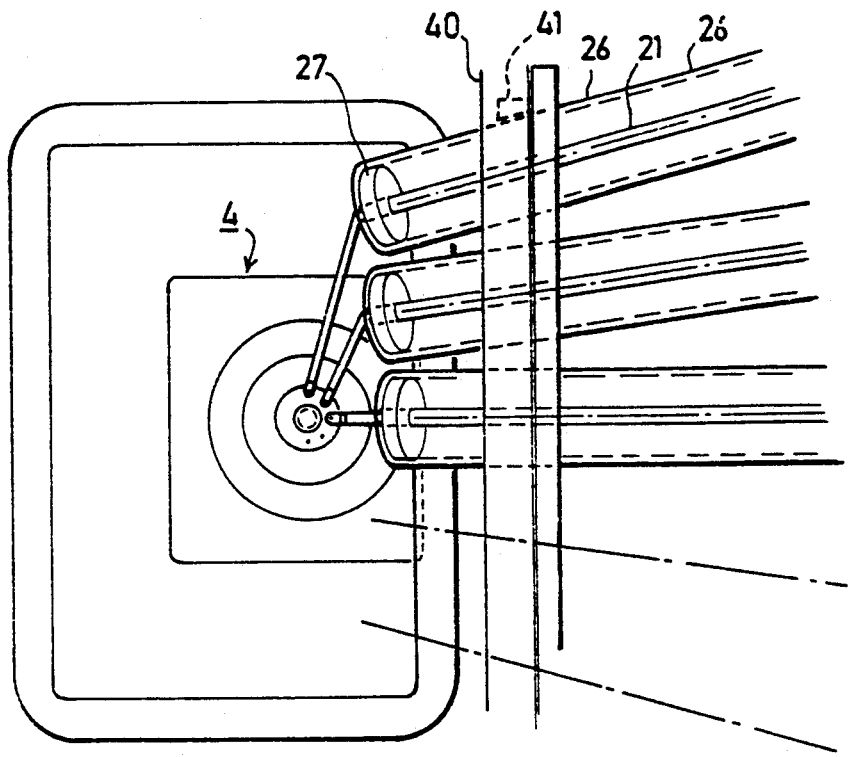
FIGS. 5 and 6 are pictorial and sectional views, respectively, more particularly illustrating the electrical connection between the high voltage pulse generator and the two electrodes.
Figure 6:
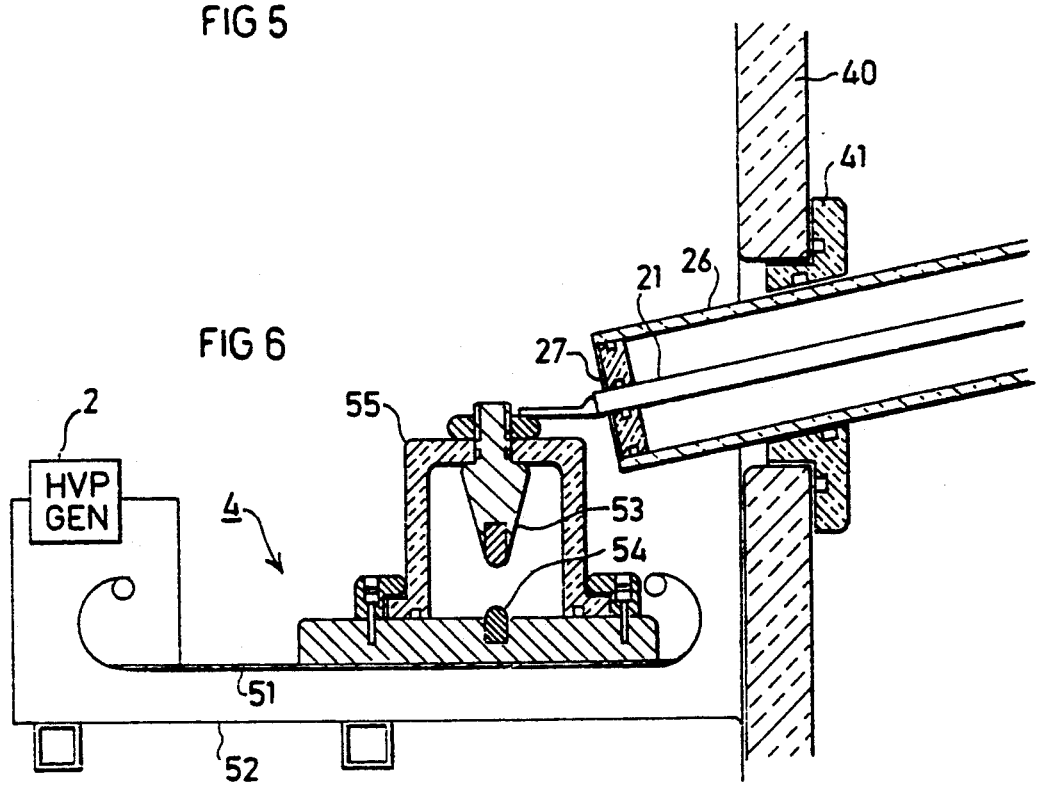

Thus, the first group of electrical conductors 20 includes five conductors 21-25 all connected at one end (their leftmost end as illustrated in FIGS. 3, 5 and 6) to the peaking capacitor 4 (FIGS. 5 and 6) of the high voltage pulse generator 2, and fanning out sideways towards opposite ends. Each of the opposite ends of conductors 21-25 is connected to electrode 8 via the second group of electrical conductors 30 each of which also includes five conductors e.g., 31a-31e also fanning out sideways and connected to their respective conductors by an electrically-conductive adapter 32 (FIGS. 3, 4) of triangular configuration.

As shown particularly in FIG. 2, both groups of electrical conductors 20 and 30 are coplanar with electrode 8. Accordingly, the inner ends (left ends) of electrical conductors 21-25 are closest to the second electrode 10. In order to insulate those conductors from electrode 10, in view of the high voltage pulse applied between them, these conductors 21-25 are enclosed within individual sheaths 26 filled with an insulating gas under pressure. The opposite ends of each insulating sheath 26 are closed by insulating plugs 27, 28 (see FIG. 2) having lead through connections to their respective electrical conductors. Such insulating sheaths are not required in the second group of electrical conductors 30 because of their greater spacing from the ground electrode 10.

As shown particularly in FIGS. 2 and 6, the inner end of the sheathed conductors 21-25 are supported in a vertical insulating wall 40 by means of insulating bushings 41. The opposite ends of the sheathed conductors 21-25 may be similarly supported, although this is not shown in the drawings.

FIG. 6 particularly illustrates the connections of the inner ends of the conductors 21-25 to the high voltage pulse generator 2 via its peaking capacitor 4. The high voltage pulse generator 2 may be of standard construction, including a bank of capacitors charged in parallel and discharged in series. Such a high voltage pulse generator normally has a discharging rise time of approximately 100 nanoseconds for a pulse of one megavolt. Peaking capacitor 4 s included in order to shorten this rise time to about five nanoseconds. For this purpose, the peaking capacitor 4 can hold the full one megavolt, but is smaller in capacitance and inductance, and therefore is characterized by a much faster rise time.

As shown in FIG. 6, peaking capacitor 4 includes an electrode 51 which receives the pulse from the high voltage pulse generator 2, and a second electrode 52 connected to the ground electrode 10 of the EMP simulator. The high voltage pulse is applied to electrical conductors 21-25 via a spark gap defined by two spaced electrode 53, 54 enclosed within a housing 55 filled with an insulating gas, whereas the container (not shown) containing the spark gap housing, together with the remainder of the high voltage generator, is filled with an insulating oil. Thus, the high voltage pulse received from generator 2, of a magnitude of about one megavolt and having a rise time of about 100 nanoseconds, is transmitted to electrode 8 of the simulator via the spark gap electrodes 53, 54 of the peaking capacitor 4, the five fanned-out sheathed conductors 21-25, and their respective five fanned-out conductors (e.g. 31a-31e, FIG. 4).

The angle between the plane of the ground electrode 10 and of electrode 8, including its respective electrical conductor groups 20 and 30, is preferrably between 10-15°. In the described preferred embodiment this angle is 11.3°. In addition, in the described preferred embodiment the distance $S_1$ (FIG. 2), between point 0 (the imaginary intersection point of the plane of electrode 8 with the plane of electrode 10) and the supporting wall 40 for supporting one end of the sheathed electrical conductors 21-25, is 2000 mm; distance $S_2$, between wall 40 and the point of fanning-out of the group 20 conductors 21-25 to the group 30 conductors is 2000 mm; and distance $S_3$, from the latter point to the connections of the unsheathed conductors 30 to electrode 8, is also 2000 mm. In addition, the height $H_1$, between the point of fanning-out of the conductors of group 20 into the conductors of group 30, is approximately 800 mm; and height $H_2$, at which the conductors of group 30 are connected to electrode 8, is about 1200 mm.

While the invention has been described with respect to one preferred embodiment, it will be appreciated that many variations may be made. For example, the tubes 26 may be filled with an insulating oil, rather than a gas. Other variations, modification and applications of the invention will be apparent.

What is claimed is:

1. Electrical apparatus particularly useful as an electromagnetic pulse simulator including a pair of large-area electrodes mounted in spaced apart relation, and a high voltage generator electrically connected to the two electrodes to apply a high voltage between them; characterized in that the electrical connection of said high-voltage generator and at least one electrode comprises a plurality of electrical conductors in mutually-spaced relation with each conductor being enclosed within an insulating sheath filled with an insulating gas under pressure, said electrical conductors being electrically connected in parallel between said high-voltage generator and said one electrode.

2. The apparatus according to claim 1, wherein said sheathed electrical conductors fan sideways from their ends connected to the high-voltage generator towards their opposite ends such that the ends of the sheathed electrical conductors connected to said one electrode are spaced further apart from each other than the ends of the sheathed electrical conductors connected to said high-voltage generator.

3. The apparatus according to claim 2, wherein said sheathed electrical conductors diverge outwardly from their one ends connected to said high-voltage generator away from the other of said large-area electrodes.

4. The apparatus according to claim 3, wherein said sheathed electrical conductors are coplanar with said one electrode.

5. The apparatus according to claim 4, wherein there are at least three electrical conductors connected between said high-voltage generator and said one electrode.

6. The apparatus according to claim 4, wherein each of said sheathed electrical conductors is electrically connected to one edge of said one electrode by a second plurality of electrical conductors coplanar with said plurality of sheathed electrical conductors and fanning sideways from their points of connection to their respective sheathed electrical conductors towards their opposite ends connected to said one electrode, such that the ends of said second plurality of electrical conductors for each sheathed electrical conductor are spaced further apart from each other at their ends connected to said one electrode than at their ends connected to the respective sheathed electrical conductor.

7. The apparatus according to claim 6, wherein there are at least three electrical conductors in said second plurality.

8. The apparatus according to claim 4, wherein the plane of said one electrode and said plurality of sheathed electrical conductors is at an angle of 10–15° with respect to the plane of the other electrode.

9. The apparatus according to claim 8, wherein said angle is 11.3°.

10. The apparatus according to claim 6, wherein the length of said sheathed electrical conductors is approximately equal to the length of said second plurality of electrical conductors.

11. The apparatus according to claim 1, wherein said high-voltage generator includes a bank of capacitors charged in parallel and discharged in series, and a peaking capacitor connected between said bank of capacitors and said sheathed electrical conductors.

12. The apparatus according to claim 11, wherein said peaking capacitor is connected via a spark gap to said sheathed electrical conductors.

13. The apparatus according to claim 1, wherein said one large-area electrode is a wire mesh, and the other electrode is a conductive plate.

14. Electrical apparatus particularly useful as an electromagnetic pulse simulator including a pair of large-area electrodes mounted in spaced apart relation, and a high voltage generator electrically connected to the two electrodes to apply a high voltage between them;

the electrical connection of said high-voltage generator to at least one of said electrodes comprising a plurality of parallel-connected electrical conductors in mutually-spaced relation with each conductor being enclosed within an insulating sheath filled with an insulating gas under pressure;

each of said sheathed electrical conductors being electrically connected to one edge of said one electrode by a second plurality of electrical conductors coplanar with said plurality of sheathed electrical conductors and fanning sideways from their points of connection to their respective sheathed electrical conductors towards their opposite ends connected to said one electrode, such that the ends of said second plurality of electrical conductors for each sheathed electrical conductor are spaced further apart from each other at their ends connected to said one electrode than at their ends connected to the respective sheathed electrical conductor.

15. The apparatus according to claim 14, wherein said sheathed electrical conductors fan sideways from their ends connected to the high-voltage generator towards their opposite ends such that the ends of the sheathed electrical conductors connected to said one electrode are spaced further apart from each other than the ends of the sheathed electrical conductors connected to said high-voltage generator.

16. The apparatus according to claim 15, wherein said sheathed electrical conductors diverge outwardly from their one ends connected to said high-voltage generator away from the other of said large-area electrodes.

17. The apparatus according to claim 16, wherein said sheathed electrical conductors are coplanar with said one electrode.

18. The apparatus according to claim 14, wherein the plane of said one electrode and said plurality of sheathed electrical conductors is at an angle of 10–15° with respect to the plane of the other electrode.

19. The apparatus according to claim 14, wherein the length of said sheathed electrical conductors is approximately equal to the length of said second plurality of electrical conductors.

20. The apparatus according to claim 14, wherein said high-voltage generator includes a bank of capacitors charged in parallel and discharged in series, and a peaking capacitor connected between said bank of capacitors and said sheathed electrical conductors; wherein said peaking capacitor is connected via a spark gap to said sheathed electrical conductors; and wherein said one large-area electrode is a wire mesh, and the other electrode is a conductive plate.

* * * * *